(12) United States Patent
Lee et al.

(10) Patent No.: US 7,652,725 B2
(45) Date of Patent: Jan. 26, 2010

(54) LIQUID CRYSTAL DISPLAY AND THIN FILM TRANSISTOR ARRAY PANEL THEREFOR

(75) Inventors: Jung-Hee Lee, Suwon (KR); Yoon-Sung Um, Yongin (KR); Jong-Ho Son, Seoul (KR); Jae-Jin Lyu, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 340 days.

(21) Appl. No.: 11/288,246

(22) Filed: Nov. 29, 2005

(65) Prior Publication Data

US 2006/0072048 A1 Apr. 6, 2006

Related U.S. Application Data

(63) Continuation of application No. 10/445,849, filed on May 28, 2003, now Pat. No. 6,999,134.

(30) Foreign Application Priority Data

Nov. 14, 2002 (KR) .......................... 2002-0070706

(51) Int. Cl.
*G02F 1/1343* (2006.01)

(52) U.S. Cl. .............. 349/38; 349/43; 349/48; 349/144

(58) Field of Classification Search ............. 349/38, 349/42–43, 48, 139, 144
See application file for complete search history.

(56) References Cited

U.S. PATENT DOCUMENTS 5,818,407 A * 10/1998 Hori et al. .................. 345/92
6,191,831 B1 * 2/2001 Kim et al. .................. 349/43
6,249,325 B1 * 6/2001 Ohkawara et al. ......... 349/38
6,724,444 B2 * 4/2004 Ashizawa et al. ......... 349/43
7,084,942 B2 * 8/2006 Luo .......................... 349/114
2001/0030719 A1 * 10/2001 Yamaguchi et al. ....... 349/43
2003/0025661 A1 * 2/2003 Karman et al. ............ 345/87
2006/0007082 A1 * 1/2006 Chiu .......................... 345/87

FOREIGN PATENT DOCUMENTS

| CN | 1366653 | 8/2002 |
|---|---|---|
| JP | 07072509 | 3/1995 |
| JP | 2002287712 | 10/2002 |
| KR | 199611524 | 4/1996 |

* cited by examiner

*Primary Examiner*—David Nelms
*Assistant Examiner*—Thanh-Nhan P Nguyen
(74) *Attorney, Agent, or Firm*—Cantor Colburn LLP

(57) ABSTRACT

A thin film transistor array panel is provided, which includes: an insulating substrate; a gate line formed on the substrate and including a gate electrode; a gate insulating layer formed on the gate line; a semiconductor layer formed on the gate insulating layer opposite the gate electrode; a data line formed on the gate insulating layer and including a first source electrode located on the semiconductor layer; first and second drain electrodes formed on the semiconductor layer, separated from each other and overlapping the gate electrode; a passivation layer formed on the data line and the first and the second drain electrodes; and first and second pixel electrodes electrically connected to the first and the second drain electrodes, respectively, wherein an overlapping area between the gate electrode and the first drain electrode is different from an overlapping area between the gate electrode and the second drain electrode.

3 Claims, 4 Drawing Sheets

LIQUID CRYSTAL DISPLAY AND THIN FILM TRANSISTOR ARRAY PANEL THEREFOR

CROSS REFERENCE

This application is a continuation application of U.S. patent application Ser. No. 10/445,849, filed on May 28, 2003 which issued as U.S. Pat. No. 6,999,134, which claims the benefit of Korean patent application no. 2002-0070706, filed on Nov. 14, 2002, which is hereby incorporated by reference for all purposes as if fully set forth herein.

BACKGROUND OF THE INVENTION (A) Field of the Invention

The present invention relates to a liquid crystal display and a thin film transistor array panel therefor.

(B) Description of the Related Art

A typical liquid crystal display ("LCD") includes an upper panel provided with a common electrode and an array of color filters, a lower panel provided with a plurality of thin film transistors ("TFTs") and a plurality of pixel electrodes, and a liquid crystal layer interposed therebetween. The pixel electrodes and the common electrode are supplied with electric voltages and the voltage difference therebetween causes electric field. The variation of the electric field changes the orientations of liquid crystal molecules in the liquid crystal layer, and thus it changes the transmittance of light passing through the liquid crystal layer. As a result, the LCD displays desired images by adjusting the voltage difference between the pixel electrodes and the common electrode.

Since the LCD has disadvantages of narrow viewing angle and poor lateral visibility, several techniques for improving these disadvantages have been developed. Among these techniques, the provision of cutouts or projections on the pixel electrodes and the common electrode opposite each other along with the vertical alignment of the liquid crystal molecules with respect to the panels is promising.

The cutouts provided at the pixel electrodes and the common electrode induce fringe field, which disperses the tilt directions of the liquid crystal molecules to give wide viewing angle. The provision of the projections on the pixel electrode and the common electrode distorts the electric field to adjust the tilt directions of the liquid crystal molecules. The liquid crystal layer of the LCD provided with the cutouts or the protrusions is divided into a plurality of domains based on the tilt directions of the liquid crystal molecules.

However, the lateral visibility of these conventional LCDs is still poor since the tilt angles of the liquid crystal molecules even in the different domains are the same for the same voltages applied to the pixel electrodes.

SUMMARY OF THE INVENTION

A thin film transistor array panel is provided, which includes: first and second signal lines transmitting first and second signals, respectively; first and second switching elements connected to the first and the second signal lines, each of the first and the second switching elements having a first terminal connected to the first signal line, a second terminal connected to the second signal and a third terminal and transmitting the second signal in response to the first signal; and first and second liquid crystal capacitors connected to the third terminals of the first and the second switching elements, respectively, wherein a capacitance between the first and the third terminals of the first switching element is different from a capacitance between the first and the third terminals of the second switching element.

The liquid crystal display preferably includes first and second storage capacitors connected to the third terminals of the first and the second switching elements in parallel to the first and the second liquid crystal capacitors, respectively.

A thin film transistor array panel is provided, which includes: an insulating substrate; a first signal line provided on the substrate; a second signal line provided on the substrate; first and second thin film transistors connected to the first signal line and the second signal line, each of the first and the second thin film transistors having a first terminal connected to the first signal line, a second terminal connected to the second signal and a third terminal; and first and second pixel electrodes connected to the third terminals of the first and the second thin film transistors, respectively, wherein a capacitance between the first and the third terminals of the first thin film transistor is different from a capacitance between the first and the third terminals of the second thin film transistor.

Another liquid crystal display is provide, which includes: a first panel including a first insulating substrate, a first signal line provided on the first substrate, a second signal line provided on the first substrate, first and second thin film transistors connected to the first signal line and the second signal line, and first and second pixel electrodes connected to the first and the second thin film transistors, respectively; a second panel facing the first panel and including a second insulating substrate and a common electrode provided on the second substrate; and a liquid crystal layer interposed between the first panel and the second panel, wherein each of the first and the second thin film transistors has a first terminal connected to the first signal line, a second terminal connected to the second signal and a third terminal connected to a corresponding one of the first and the second pixel electrodes, and a capacitance between the first and the third terminals of the first thin film transistor is different from a capacitance between the first and the third terminals of the second thin film transistor.

Another thin film transistor array panel is provided, which includes: an insulating substrate; a gate line formed on the substrate and including a gate electrode; a gate insulating layer formed on the gate line; a semiconductor layer formed on the gate insulating layer opposite the gate electrode; a data line formed on the gate insulating layer and including a first source electrode located on the semiconductor layer; first and second drain electrodes formed on the semiconductor layer, separated from each other and overlapping the gate electrode; a passivation layer formed on the data line and the first and the second drain electrodes; and first and second pixel electrodes electrically connected to the first and the second drain electrodes, respectively, wherein an overlapping area between the gate electrode and the first drain electrode is different from an overlapping area between the gate electrode and the second drain electrode.

The source electrode may be connected to the first and the second drain electrodes via the semiconductor layer.

Alternatively, the first source electrode is connected to the first drain electrode via the semiconductor layer, and the data line further comprises a second source electrode located on the semiconductor layer and connected to the second drain electrode via the semiconductor layer.

The thin film transistor array panel preferably further includes an ohmic contact layer disposed between the semiconductor layer and the source electrode and the first and the second drain electrodes and/or a storage electrode overlapping at least one of the first and the second pixel electrodes.

BRIEF DESCRIPTION OF THE DRAWINGS

The above and other advantages of the present invention will become more apparent by describing preferred embodiments thereof in detail with reference to the accompanying drawings in which.

DETAILED DESCRIPTION OF PREFERRED EMBODIMENTS

Figure 1:
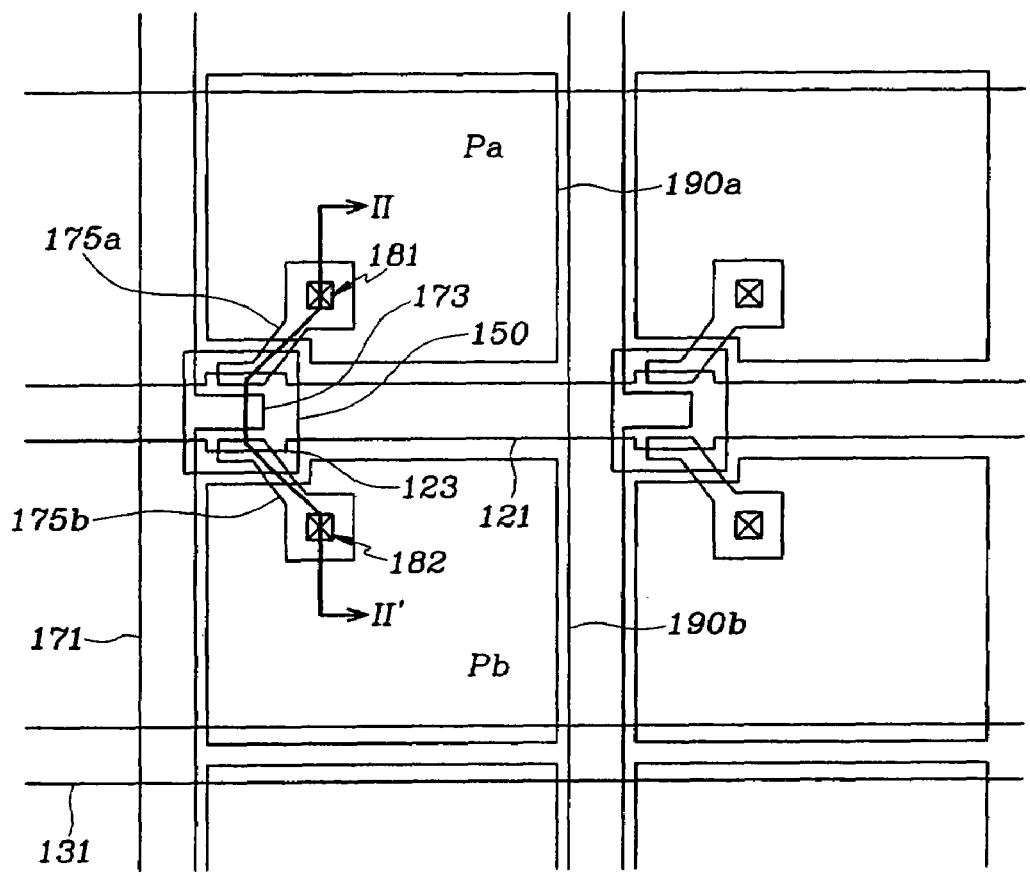
FIG. 1 is a layout view of a TFT array panel for an LCD according to an embodiment of the present invention.

The present invention now will be described more fully hereinafter with reference to the accompanying drawings, in which preferred embodiments of the inventions invention are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, LCDs according to embodiments of this invention will be described in detail with reference to the accompanying drawings.

Figure 2:
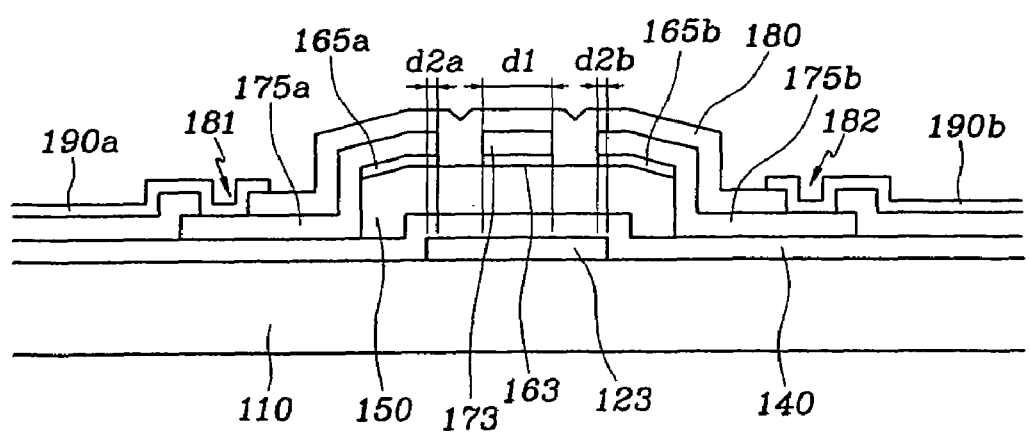
FIG. 2 is a sectional view of the TFT array panel shown in FIG. 1 taken along the line II-II'.
Figure 3:
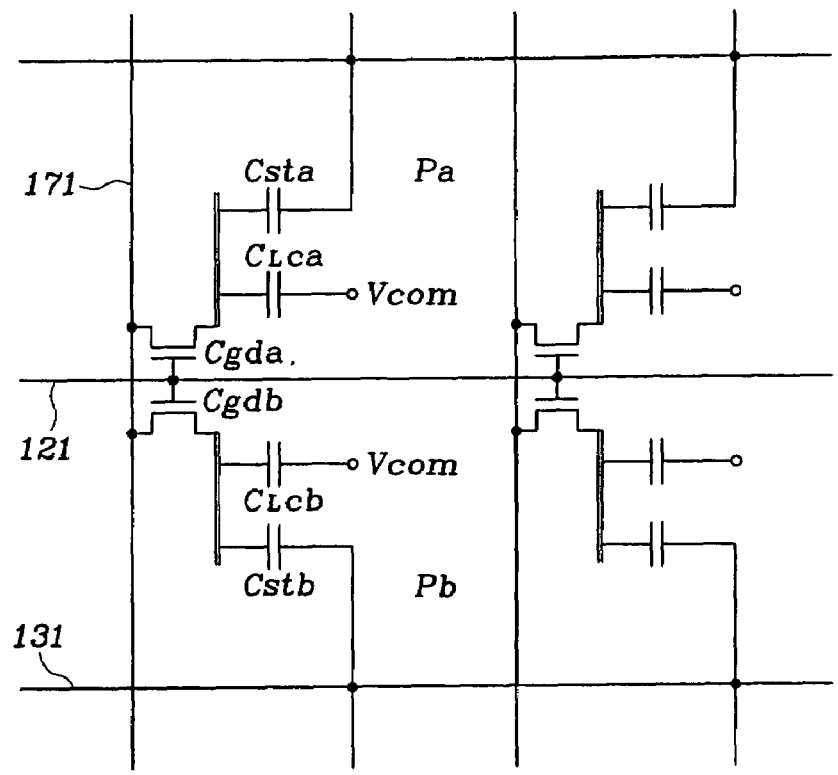
FIG. 3 is an equivalent circuit diagram of an LCD including the TFT array panel shown in FIGS. 1 and 2.

FIG. 1 is a layout view of a TFT array panel for an LCD according to an embodiment of the present invention, FIG. 2 is a sectional view of the TFT array panel shown in FIG. 1 taken along the line II-II', and FIG. 3 is an equivalent circuit diagram of an LCD including the TFT array panel shown in FIGS. 1 and 2.

A plurality of gate lines 121 and a plurality of storage electrode lines 131 are formed on an insulating substrate 110 preferably made of transparent glass. The gate lines 121 extend substantially in a row direction and substantially parallel to each other and each gate line 121 includes a plurality of expansions forming gate electrodes 123. The storage electrode lines 131 extend substantially parallel to the gate lines 121 and are supplied with a common voltage Vcom to be applied to a common electrode (not shown) of another panel (not shown) of an LCD. Each storage electrode 131 may include a plurality of branches (not shown).

The gate lines 121 and the storage electrode lines 131 are preferably made of Al, Cr or their alloys, Mo or Mo alloy. The gate lines 121 and the storage electrode lines 131 preferably include a layer preferably made of Cr or Mo alloys having excellent physical and chemical characteristics and another layer preferably made of Al or Ag alloys having low resistivity. In addition, the lateral sides of the gate lines 121 are tapered, and the inclination angle of the lateral sides with respect to a horizontal surface ranges 30-80 degrees.

A gate insulating layer 140 is formed on the gate lines 121 and the storage electrode lines 131.

A plurality of semiconductor islands 150 preferably made of hydrogenated amorphous silicon ("a-Si") are formed on the gate insulating layer 140 and located opposite the gate electrodes 123 with respect to the gate insulating layer 130. Each semiconductor island 150 forms a channel of TFT.

A plurality of sets of ohmic contacts 163, 165a and 165b preferably made of silicide or hydrogenated a-Si heavily doped with n type impurity such as phosphorous are formed on the semiconductor islands 150. The lateral sides of the semiconductor islands 150 and the ohmic contacts 163, 165a and 165b are tapered, and the inclination angles thereof are in the range between 30-80 degrees.

A plurality of sets of a data line 171 and a plurality of pairs of first and second drain electrodes 175a and 175b are formed on the ohmic contacts 163, 165a and 165b, and the gate insulating layer 140. The data lines 171 extend substantially in the column direction intersect the gate lines 121 and the storage electrode lines 131. Each data line 171 includes a plurality of source electrodes 173 extending onto the semiconductor islands 150. Each pair of the drain electrodes 175a and 175b are separated from an associated source electrode 173, located opposite each other with respect to the source electrode 173, and extends in opposite directions from an associated semiconductor island 150 on an associated gate electrode 123.

The data lines 171 and the drain electrodes 175a and 175b are preferably made of Al, Cr or their alloys, Mo or Mo alloy. The data lines 171 and the drain electrodes 175a and 175b preferably include a layer preferably made of Cr or Mo alloys having excellent physical and chemical characteristics and another layer preferably made of Al or Ag alloys having low resistivity. The data lines 171 and the drain electrodes 175a and 175b have tapered lateral sides, and the inclination angles of the lateral sides ranges 30-80 degrees.

The ohmic contacts 163, 165a and 165b are interposed only between the semiconductor islands 150 and the data lines 171 and the drain electrodes 175a and 175b to reduce the contact resistance therebetween. Some portions of the semiconductor islands 150 are exposed out of the data lines 171 and the drain electrodes 175a and 175b.

The gate electrode 123, the source electrode 173 and the first drain electrode 175a along with a portion of the semiconductor island 150 located between the source electrode 173 and the first drain electrode 175a form a TFT, while the gate electrode 123, the source electrode 173 and the second drain electrode 175b along with a portion of the semiconductor island 150 located between the source electrode 173 and the second drain electrode 175b form another TFT.

Each of the first and the second drain electrodes 175a and 175b overlap the gate electrode 123 to form a parasitic capacitor Cgda or Cgdb. The capacitance of the parasitic capacitor Cgda or Cgdb is proportional to the overlapping area. According to an embodiment of the present invention, the overlapping area between the first drain electrode 175a and the gate electrode 123 is different from the overlapping area between the second drain electrode 175b and the gate electrode 123 such that the capacitance between the first drain electrode 175a and the gate electrode 123 is different from the capacitance between the second drain electrode 175b and the gate electrode 123.

A passivation layer 180 preferably made of silicon nitride or organic insulator is formed on the data lines 171 and the drain electrodes 175a and 175b, and the exposed portions of the semiconductor islands 150. The passivation layer 180 is provided with a plurality of first and second contact holes 181 and 182 exposing the first and the second drain electrodes 175a and 175b, respectively.

A plurality of pairs of first and second pixel electrodes 190a and 190b are formed on the passivation layer 180. The first and the second pixel electrodes 190a and 190b are connected to the first and the second drain electrodes 175a and 175b through the first and the second contact holes, respectively. That is, a pair of the first and the second pixel electrodes 190a and 190b are connected to respective TFTs connected to the same gate line 121 and the same data line 171. The first and the second pixel electrodes 190a and 190b overlap the storage electrode lines 131 to form storage capacitors Csta and Cstb, respectively. The pixel electrodes 190a and 190b are preferably made of transparent conductive material such as indium zinc oxide ("IZO") and indium tin oxide ("ITO"), or reflective conductive material.

An LCD according to an embodiment of the present invention further includes a common electrode panel (not shown) facing the TFT array panel as well as the TFT array panel and a liquid crystal layer interposed therebetween. The common electrode panel includes a common electrode (not shown) forming a plurality of liquid crystal capacitors CLCa and CLCa along with the first and the second pixel electrodes 190a and 190b of the TFT array panel. As described above, the common electrode is supplied with the common voltage Vcom. A polarizer or polarizers (not shown) are attached on outer surfaces of the panels, and a retardation film or films (not shown) may be attached to the outer surface of the common electrode panel.

In circuital view, an LCD according to this embodiment of the present invention includes a plurality of pixels including two subpixels. Each subpixel includes a TFT including a parasitic capacitor Cgda or Cgdb, and a liquid crystal capacitor CLCa or CLCb and a storage capacitor Csta or Cstb connected to the TFT in parallel as shown in FIG. 3.

Figure 4:
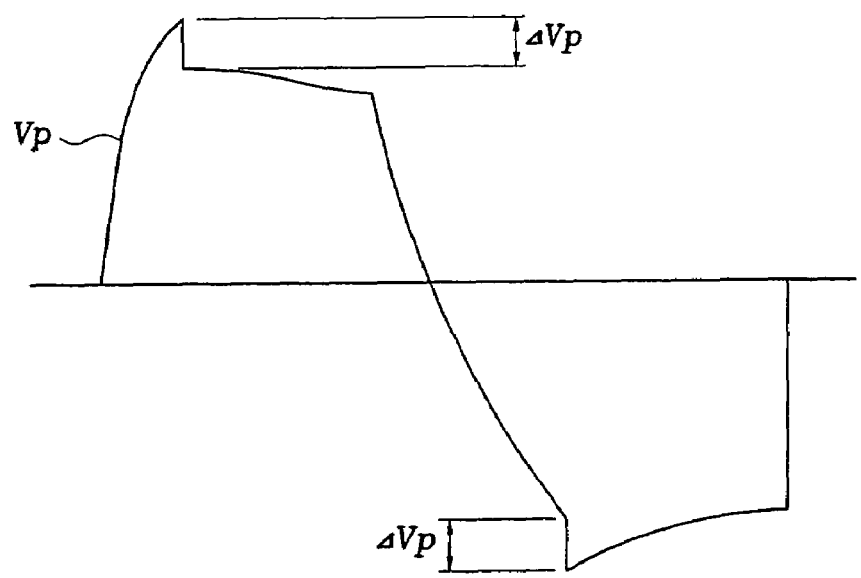
FIG. 4 illustrates a pixel voltage of an LCD as function of time.

When a gate-on voltage Vg is applied to a gate line 121 and a data voltage Vd is applied to a data line 171, the TFTs connected to the gate line 121 are turned on and thus the capacitors CLCa and CLCa connected thereto are charged with pixel voltages Vpa and Vpb. If the data voltage Vd is larger than the common voltage Vcom, the pixel voltages Vpa and Vpb increase during the application of the data voltage Vd and are abruptly dropped upon turning off of the TFTs as shown in FIG. 4, which illustrates a pixel voltage Vp as function of time. On the contrary, the data voltage Vd is smaller than the common voltage Vcom, the pixel voltages Vpa and Vpb decrease during the application of the data voltage Vd, and are abruptly increased upon turning off of the TFTs. The voltage drop is called a "kick-back voltage," which is resulted from the parasitic capacitor Cgda or Cgdb.

The kick-back voltages ΔVpa and ΔVpb for two respective subpixels are given by:

$$\Delta Vpa = Vg \times \frac{Cgda}{C_{LC}a + Csta + Cgda} = Vg\left(1 - \frac{C_{LC}a + Csta}{C_{LC}a + Csta + Cgda}\right) \quad (1)$$

$$\Delta Vpb = Vg \times \frac{Cgdb}{C_{LC}b + Cstb + Cgdb} = Vg\left(1 - \frac{C_{LC}b + Cstb}{C_{LC}b + Cstb + Cgdb}\right) \quad (2)$$

where the capacitors and their capacitances are indicated by the same reference numerals.

As shown in Equations (1) and (2), the kick-back voltage increases as the parasitic capacitance increases and vice versa.

According to this embodiment, the parasitic capacitance Cgda is different from the parasitic capacitance Cgdb and thus the kick-back voltage ΔVpa is different from the kick-back voltage ΔVpb since the overlapping area between the first drain electrode 175a and the gate electrode 123 is different from the overlapping area between the second drain electrode 175b and the gate electrode 123 as described above.

Referring to FIG. 2, the overlapping areas are adjusted by changing the overlapping width while maintaining the overlapping length to be constant. In this embodiment, the overlapping width d2a between the first drain electrode 175a and the gate electrode 123 is different from the overlapping width d2b between the second drain electrode 175b and the gate electrode 123.

Accordingly, the pixel voltage Vpa is different from the pixel voltage Vpb.

It is noted that the kick-back voltages ΔVpa and ΔVpb are as small as possible since the kick-back voltages may generate afterimage and flicker. A measured value of a kick-back voltage upon application of a data voltage Vd of 10 V was about 0.5 V to 1.0 V, which was expected to be about 0.8 V to 0.9 V through a simulation.

The difference of the pixel voltages Vpa and Vpb differentiates the strength of electric fields in respective subpixel regions Pa and Pb, which are portions of the liquid crystal layer located on the first and the second pixel electrodes 190a and 190b, respectively. The different field strength in turn differentiates the tilt angles of liquid crystal molecules in the subpixel regions Pa and Pb.

Figure 5:
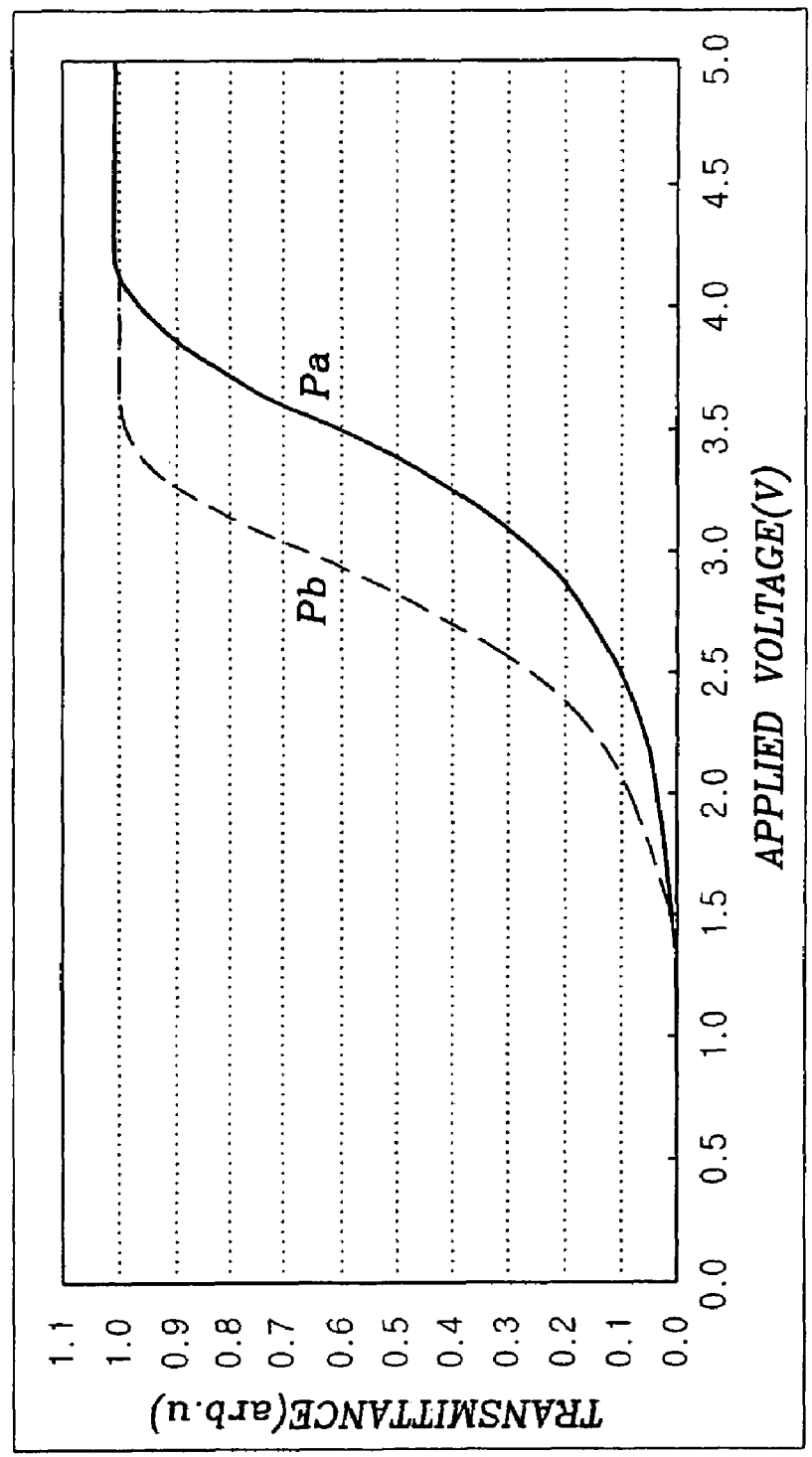
FIG. 5 shows voltage-transmittance curves for subpixel regions of a normally black mode LCD.

FIG. 5 shows voltage-transmittance (V-T) curves for the subpixel regions Pa and Pb of a normally black mode LCD, which are different from each other. The V-T curve for the subpixel region Pa with a larger parasitic capacitance Cgda underlies that for the subpixel region Pb with a smaller parasitic capacitance Cgdb.

Accordingly, the characteristics of the subpixel regions Pa and Pb effectively compensate each other to widen the viewing angle of the LCD. The LCD may be in a vertically aligned (VA) mode, twisted-nematic (TN) mode or optical-compensated bend (OCB) mode.

Now, an LCD according to another embodiment of the present invention is described in detail with reference to FIGS. 6-8.

Figure 6:
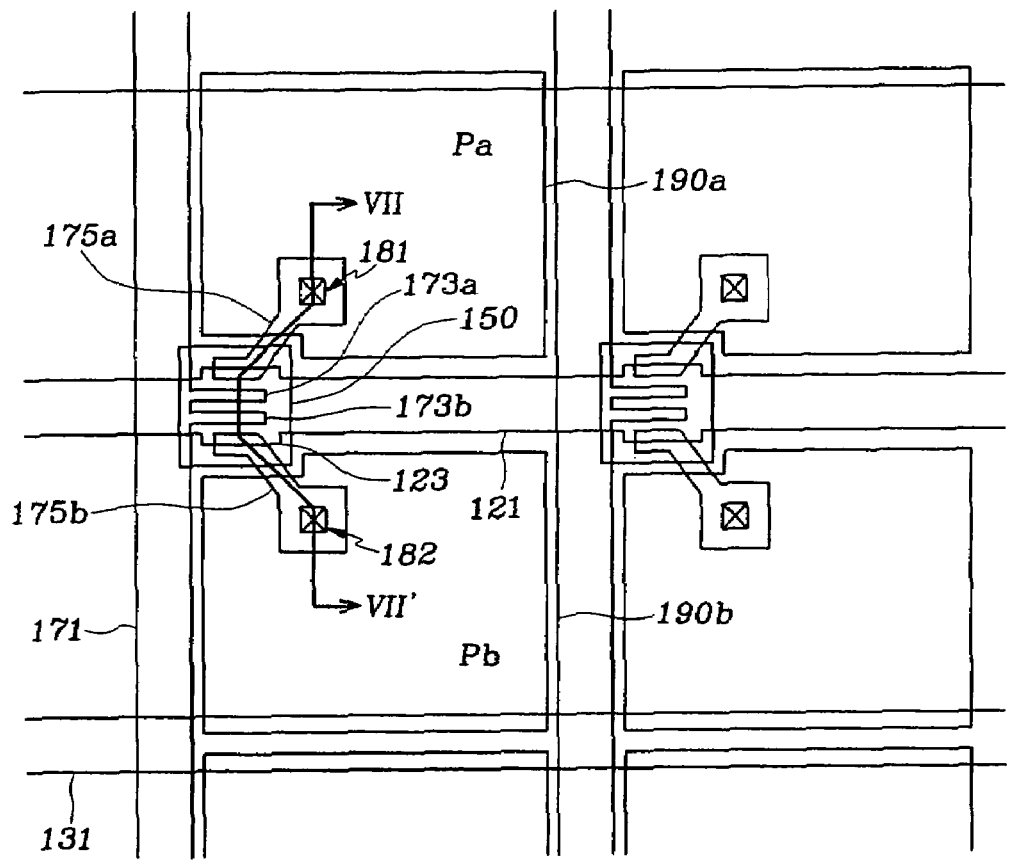
FIG. 6 is a layout view of a TFT array panel for an LCD according to another embodiment of the present invention.
Figure 7:
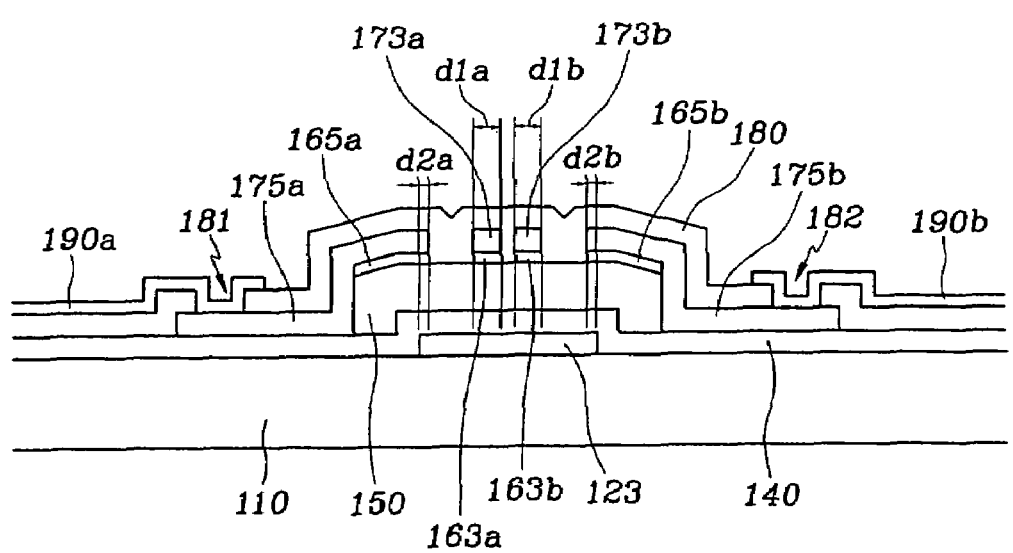
FIG. 7 is a sectional view of the TFT array panel shown in FIG. 1 taken along the line VII-VII'.

FIG. 6 is a layout view of a TFT array panel for an LCD according to another embodiment of the present invention, and FIG. 7 is a sectional view of the TFT array panel shown in FIG. 1 taken along the line VII-VII'.

Referring to FIGS. 6 and 7, a TFT array panel according to this embodiment includes a plurality of gate lines 121 and a plurality of storage electrode lines 131 formed on an insulating substrate 110, a gate insulating layer 140 formed on the gate lines 121 and the storage electrode lines 131, and a plurality of semiconductor islands 150 formed on the gate insulating layer 140.

A plurality of ohmic contacts 163a, 163b, 165a and 165b are formed on the semiconductor islands 150.

A plurality of sets of a data line 171 and a plurality of pairs of first and second drain electrodes 175a and 175b are formed on the ohmic contacts 163, 165a and 165b, and the gate insulating layer 140. Each data line 171 includes a plurality of first and second source electrodes 173a and 173b extending onto the semiconductor islands 150. Each of the first and the second drain electrodes 175a and 175b are separated from the first and the second source electrodes 173a and 173b. The first source electrode 173a and the first drain electrode 175a face each other while the second source electrode 173b and the second drain electrode 175b faces each other.

The gate electrode 123, the first source electrode 173a and the first drain electrode 175a along with a portion of the semiconductor island 150 located between the first source electrode 173a and the first drain electrode 175a form a TFT, while the gate electrode 123, the second source electrode 173b and the second drain electrode 175b along with a portion of the semiconductor island 150 located between the second source electrode 173b and the second drain electrode 175b form another TFT.

According to this embodiment of the present invention, the overlapping areas between the first drain electrode 175a and the gate electrode 123 and between the second drain electrode 175b and the gate electrode 123 are different such that the capacitance between the first drain electrode 175a and the gate electrode 123 is different from the capacitance between the second drain electrode 175b and the gate electrode 123.

A passivation layer 180 is formed on the data lines 171 and the drain electrodes 175a and 175b, and the semiconductor islands 150. The passivation layer 180 is provided with a plurality of first and second contact holes 181 and 182 exposing the first and the second drain electrodes 175a and 175b, respectively. A plurality of pairs of first and second pixel electrodes 190a and 190b are formed on the passivation layer 180. The first and the second pixel electrodes 190a and 190b are connected to the first and the second drain electrodes 175a and 175b through the first and the second contact holes, respectively. That is, a pair of the first and the second pixel electrodes 190a and 190b are connected to respective TFTs connected to the same gate line 121 and the same data line 171. The first and the second pixel electrodes 190a and 190b overlap the storage electrode lines 131 to form storage capacitors Csta and Cstb, respectively.

According to this embodiment, the parasitic capacitance Cgda is different from the parasitic capacitance Cgdb and thus the kick-back voltage ΔVpa is different from the kick-back voltage ΔVpb since the overlapping area between the first drain electrode 175a and the gate electrode 123 is different from the overlapping area between the second drain electrode 175b and the gate electrode 123 as described above.

Referring to FIG. 7, the overlapping width d2a between the first drain electrode 175a and the gate electrode 123 is different from the overlapping width d2b between the second drain electrode 175b and the gate electrode 123.

Accordingly, the pixel voltage Vpa is different from the pixel voltage Vpb, and V-T curves for subpixel regions Pa and Pb on the first and the second pixel electrodes 190a and 190b are different from each other. Therefore, the characteristics of the subpixel regions Pa and Pb effectively compensate each other to widen the viewing angle of the LCD.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A liquid crystal display, comprising:
a plurality of gate lines;
a plurality of data lines intersecting the gate lines; and
a plurality of pixels coupled to the gate lines and the data lines, wherein each pixel includes:
a first switching element;
a second switching element;
a first liquid crystal capacitor connected to the first switching element; and
a second liquid crystal capacitor connected to the second switching element,
wherein the first liquid crystal capacitor has a first voltage different from a second voltage of the second liquid crystal capacitor, and
wherein the first switching element includes a first terminal, a second terminal, and a third terminal connected to the first liquid crystal capacitor and the second switching element includes a first terminal, a second terminal, and a third terminal connected to the second liquid crystal capacitor, and
a capacitance between the first terminal and the third terminal of the first switching element is different from a capacitance that between the first terminal and the third terminal of the second switching element,
a first storage capacitor connected to the third terminal of the first switching element; and
a second storage capacitor connected to the third terminal of the second switching element.

2. The liquid crystal display of claim 1, wherein the first voltage and the second voltage are originated from a single signal.

3. A liquid crystal display, comprising:
a first panel including:
a first insulating substrate;
a plurality of gate lines provided on the first substrate;
a plurality of data lines provided on the first substrate;
a plurality of first thin film transistors connected to the gate lines and the data lines;
a plurality of second thin film transistors connected to the gate lines and the data lines;
a plurality of first pixel electrodes connected to the first thin film transistors; and
a plurality of second pixel electrodes connected to the second thin film transistors;
a second panel facing the first panel and including a second insulating substrate and a common electrode provided on the second substrate; and
a liquid crystal layer interposed between the first panel and the second panel,
wherein two different voltages originated from a single signal are applied to the first and second pixel electrodes, and
wherein the first thin film transistor includes a first terminal, a second terminal, and a third terminal connected to the first pixel electrode and the second thin film transistor includes a first terminal, a second terminal, and a third terminal connected to the second pixel electrode, and
a capacitance between the first terminal and the third terminal of the first thin film transistor is different from that between the first terminal and the third terminal of the second thin film transistor,
wherein the third terminal of the first thin film transistor connects to a first storage capacitor and the third terminal of the second thin film transistor connects to a second storage capacitor.

* * * * *

UNITED STATES PATENT AND TRADEMARK OFFICE
CERTIFICATE OF CORRECTION

PATENT NO. : 7,652,725 B2  Page 1 of 1
APPLICATION NO. : 11/288246
DATED : January 26, 2010
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 662 days.

Signed and Sealed this

Twenty-eighth Day of December, 2010

David J. Kappos
*Director of the United States Patent and Trademark Office*